United States Patent
Koiwai et al.

(10) Patent No.: US 7,427,741 B2
(45) Date of Patent: Sep. 23, 2008

(54) BIAS CONTROL APPARATUS FOR AVALANCHE PHOTODIODE AND OPTICAL APPARATUS UTILIZING THE BIAS CONTROL APPARATUS

(75) Inventors: Yasushi Koiwai, Kawasaki (JP); Hiroki Kanesaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/953,271

(22) Filed: Dec. 10, 2007

(65) Prior Publication Data

US 2008/0135736 A1 Jun. 12, 2008

(30) Foreign Application Priority Data

Dec. 11, 2006 (JP) .............................. 2006-332728

(51) Int. Cl.
*G01J 1/44* (2006.01)
*H01L 29/866* (2006.01)

(52) U.S. Cl. ................................. 250/214.1; 250/214 R; 250/238; 257/431; 257/603

(58) Field of Classification Search ............. 250/214 R, 250/214.1, 214 AG, 214 C, 205, 238, 370.11, 250/370.15; 324/514; 257/106, 431, 603–606; 398/202–214

See application file for complete search history.

(56) References Cited

U.S. PATENT DOCUMENTS

| | | | |
|---|---|---|---|
| 5,548,112 A * | 8/1996 | Nakase et al. ............ | 250/214 C |
| 6,643,472 B1 * | 11/2003 | Sakamoto et al. ........... | 398/202 |
| 7,214,924 B2 | 5/2007 | Ichino | |
| 7,282,692 B2 * | 10/2007 | Ichino ..................... | 250/214 R |
| 2005/0100350 A1 * | 5/2005 | Nagakubo et al. ........... | 398/208 |
| 2006/0219872 A1 * | 10/2006 | McVey ..................... | 250/214 R |
| 2006/0255245 A1 * | 11/2006 | Ichino ..................... | 250/214 R |
| 2007/0152138 A1 * | 7/2007 | Ichino ..................... | 250/214.1 |

FOREIGN PATENT DOCUMENTS

| | | |
|---|---|---|
| JP | 60-180347 | 9/1985 |
| JP | 62-10939 | 1/1987 |
| JP | 62-135004 | 6/1987 |
| JP | 2005-93834 | 4/2005 |

* cited by examiner

*Primary Examiner*—Davienne Monbleau
(74) *Attorney, Agent, or Firm*—Staas & Halsey LLP

(57) ABSTRACT

An apparatus is provided with a biasing unit supplying a bias signal to a first avalanche photodiode and a second avalanche photodiode, the bias signal having a first level and a second level, the first level causing a multiplying effect and the second level causing a non-multiplying effect for the first and the second avalanche photodiodes; a smoothing unit smoothing the bias signal biasing the first avalanche photodiode into a smoothed bias signal; a current detecting unit detecting photocurrent from the second avalanche photodiode, with a multiplying current value corresponding to the multiplying bias level and a non-multiplying current value corresponding to the non-multiplying bias level; a multiplication factor calculating unit calculating a multiplication factor of the second avalanche photodiode based on the multiplying current value and the non-multiplying current value; and a control unit controlling the first level of the bias signal based on the calculated multiplication factor.

18 Claims, 13 Drawing Sheets

BIAS CONTROL APPARATUS FOR AVALANCHE PHOTODIODE AND OPTICAL APPARATUS UTILIZING THE BIAS CONTROL APPARATUS

The present invention claims foreign priority to Japanese application 2006-332728, filed Dec. 11, 2006, which is incorporated herein by reference in its entirety.

FIELD OF THE INVENTION

The present invention relates to a bias control circuit of an avalanche photodiode (APD) and particularly to a bias control circuit of avalanche photodiode for controlling a multiplication factor of the avalanche photodiode to a constant value.

DESCRIPTION OF THE RELATED ART

An avalanche photodiode is a photodiode utilizing avalanche breakdown of carrier under a higher bias level and as a multiplication factor. APD is used in a receiving element of an optical transmitting apparatus to realize high sensitivity reception. The multiplication factor of APD is controlled with a bias level but such bias level must be controlled in accordance with change of environment temperature because it changes with temperature.

FIG. 11 is a block diagram of a bias control circuit of APD. An APD bias unit 111 of the bias control circuit of APD shown in this figure applies a bias to APD 101 of an optical receiving unit 100 via a resistor R101. A signal light is inputted to a transmission line 121 to APD 101 of the optical receiving unit 100 and thereby a photocurrent flows in accordance with a signal light. A transfer impedance amplifier (TIA) 102 converts a photocurrent flowing in APD 101 to an electric signal and then outputs the electric signal to a circuit in the subsequent stage.

APD 101 changes a multiplication factor thereof in accordance with temperature. Therefore, A bias control circuit of APD monitors ambient temperature with a temperature sensor 112 and an APD bias control unit 113 feed-forwardly controls a bias level of the APD bias unit 111 in order to keep constant the multiplication factor of APD 101.

The APD bias control unit 113 controls, for example, a bias level for temperature on the basis of attached data provided from a manufacturer of APD 101. The data attached to APD 101 shows, for example, a breakdown level at 25° C. and a primary temperature slope.

Following is an explanation of a known bias level control circuit for controlling a multiplication factor of APD to a constant value, as shown in Japanese Unexamined Patent Application Publication JP2005-93834. This circuit receives a signal light with a light receiving region having the multiplication function (limited region Ps at the center of the APD) and a light receiving region having no multiplication function (region Pm surrounded with a ring at the external circumference formed to surround the region Ps). A TIA output is branched to HPF (High Pass Filter) and LPF (Low Pass Filter), a monitor signal is extracted received by the light receiving region having no multiplication function is extracted by calculating output information of HPF and LPF, and the multiplication factor is controlled to a constant value with reference to this monitor signal.

However, the data attached to APD shows a certain difference from the actual data of APD. Therefore, it has a problem that a certain deviation is generated in the control to keep a constant multiplication factor.

FIG. 12 shows an example of the data attached to APD. The characteristic 131 shown in FIG. 12 indicates a breakdown level (VB) for temperature of APD. In the attached data, the VB of APD is indicated with a linear curve as shown by the characteristic 131.

However, the VB of the actual APD is deviated from the characteristic 131 in the attached data as shown by the characteristic 132. Therefore, deviation 133 between the characteristics 131 and 132 causes deviation in control of bias level and thereby deviation is also generated in the constant control of the multiplication factor for temperature change.

Moreover, the circuit in JP2005-93834 also has a problem that when a DC (Direct Current) element of input light from the transmission line increases, a monitor signal is deteriorated in accuracy and control of multiplication factor is disabled. In addition, when only a DC light is inputted, output information of HPF cannot be attained and control of multiplication factor is also disabled.

FIG. 13 explains operations of the bias control circuit when the DC element of signal light increases and when the signal light is a DC light. Input signal light in the first row indicates the signal light inputted from the transmission line. APD signal in the second row indicates a current of an electric signal flowing when the signal light is received.

Is designates a current element of an electric signal received with the region Ps, while Im, a current element of an electric signal (monitor signal) received with the region Pm. Ino designates a noise element included in both current elements.

Ps and Pm correspond to a first light receiving region Ps and a second light receiving region Pm in FIG. 1 of JP2005-93834. Also, Is, Im, and Ino correspond to Is, Im, Ino in FIG. 4 of JP2005-93834.

Column (1.) of FIG. 13 shows a case when a signal light with a good S/N, as shown in the first row, is inputted to the APD. In this case, by receiving the signal light, an electric signal with current of (Is+Ino+Im) having the waveform shown in the second row flows into the APD.

In HPF, a current element of Is+Ino is detected from the electric signal with current of Is+Ino+Im. As the electric signal for current element Im has a low frequency, the current element of Im is shut off. From LPF, an electric signal with current of Is+Ino+Im is outputted. Accordingly, the Im element can be extracted through subtraction of current element of Is+Ino output from the HPF. The multiplication factor of APD is expressed as M=(Is+Ino)/Im.

Column (2.) of FIG. 13 shows a case when a signal light including a large amount of DC element and has a bad S/N ratio is inputted to APD. In this case, by receiving the signal light, an electric signal with current of (Is+Ino+Im+Idc), the waveform as shown in the second row, flows into the APD.

Idc is current element of a DC element. In HPF, an electric signal with current of Is+Ino is detected from the electric signal with current of Is+Ino+Im+Idc. From the LPF, an electric signal with current of Is+Ino+Im+Idc is outputted and a current element of Im+Idc can be obtained through subtraction of the current element of Is+Ino output from the HPF. The multiplication factor M of APD is expressed as M=(Is+Ino)/(Im+Idc), M is controlled to a small value due to the influence of Idc.

Column (3.) of FIG. 13 shows a case when a signal light of only DC element, as shown in the first row, is inputted to APD. In this case, by receiving the signal light, a current (Ino+Im+Idc) having the waveform shown in the second row flows into the APD.

In the HPF, only Ino element is detected because there is no Is element. An electric signal with current of Ino+Im+Idc is outputted from the LPF and a current element of Im+Idc is obtained through subtraction of current element Ino output from the HPF. The multiplication factor M of APD is expressed as M=Ino/(Im+Idc). When the signal light has only DC element, the multiplication factor M cannot be controlled because the multiplication factor is not expressed to be related to a signal element (Is), and cannot be monitored.

As explained above, when an input signal light includes a large amount of DC element, or an input signal light has only DC element, (Im+Idc) and the multiplication factor M can not be controlled accurately.

SUMMARY

According to an aspect of an embodiment, an apparatus is provided with a biasing unit supplying a bias signal to a first avalanche photodiode and a second avalanche photodiode, the bias signal having a first level and a second level, the first level causing a multiplying effect and the second level causing a non-multiplying effect for the first and the second avalanche photodiodes; a smoothing unit smoothing the bias signal biasing the first avalanche photodiode into a smoothed bias signal; a current detecting unit detecting photocurrent from the second avalanche photodiode, with a multiplying current value corresponding to the multiplying bias level and a non-multiplying current value corresponding to the non-multiplying bias level; a multiplication factor calculating unit calculating a multiplication factor of the second avalanche photodiode based on the multiplying current value and the non-multiplying current value; and a control unit controlling the first level of the bias signal based on the calculated multiplication factor.

DESCRIPTION OF THE PREFERRED EMBODIMENTS

Figure 1:
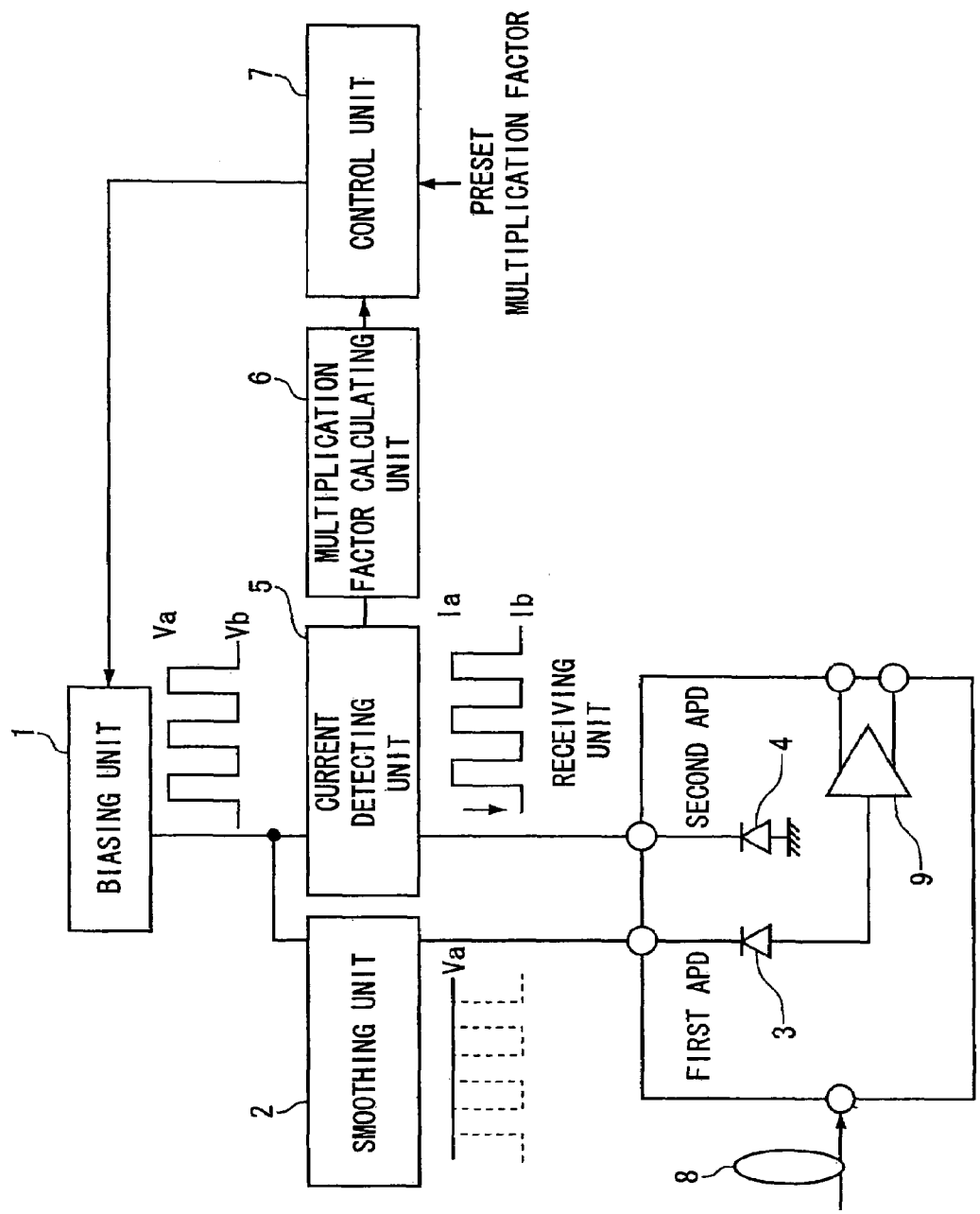
FIG. 1 is a schematic diagram showing an APD bias control circuit.

Reference will now be made in detail to embodiments, examples of which are illustrated in the accompanying drawings, wherein like reference numerals refer to like elements throughout.

FIG. 1 is a schematic diagram of an APD bias control circuit. As shown in FIG. 1, the bias control circuit includes a biasing unit 1, a smoothing unit 2, a first APD 3, a second APD 4, a current detecting unit 5, a multiplication factor calculating unit 6, a control unit 7, and a TIA 9. The first APD 3, second APD 4, and TIA 9 compose an optical receiving unit.

The biasing unit 1 outputs bias with a multiplied bias level Va, which has a multiplying effect, and bias with a non-multiplied bias level Vb, which has no multiplying effect, to the first APD 3 and the second APD 4. The multiplied bias level Va is a level having a multiplication factor larger than 1 and the non-multiplied bias level Vb is a level having a multiplication factor 1.

The smoothing unit 2 outputs a smoothed electronic signal by smoothing the bias with the multiplied bias level Va and the non-multiplied bias level Vb, outputted from the biasing unit 1. The smoothing unit 2 is, for example, an LPF which smoothes an electronic signal with the multiplied bias level Va.

The first APD 3 is biased by the smoothed bias with the multiplied bias level Va, outputted from the smoothing unit 2. The second APD 4 is biased by the bias with multiplied level Va and the non-multiplied level Vb, outputted from the biasing unit 1. The both first APD 3 and the second APD 4 receive a signal light from the transmission line 8 and have an identical characteristic.

When the second APD 4 is biased by the multiplied level Va, the current detecting unit 5 detects a multiplied current of Ia. When the second APD 4 is biased by the non-multiplied level Vb, the current detecting unit 5 detects a non-multiplied current Ib.

The multiplication factor calculating unit 6 calculates a multiplication factor (M) of the second APD 4 from the multiplied current of Ia and the non-multiplied current of Ib, which are detected by the current detecting unit 5. The multiplication factor (M) is calculated by dividing the multiplied current of Ia, a current corresponding to the multiplication factor, with the non-multiplied current of Ib.

The control unit 7 controls the multiplied bias level Va from the biasing unit 1 on the basis of the multiplication factor, which is calculated with the multiplication factor calculating unit 6, and the preset the multiplication factor.

When the multiplication factor calculated with the multiplication factor calculating unit 6 is equal to or less than the preset multiplication factor, the multiplied bias level Va is controlled to become larger. When the multiplication factor calculated with the multiplication factor calculating unit 6 is larger than the preset multiplication factor, the multiplied bias level Va is controlled to become smaller. As explained above, the multiplication factor of the first APD 3 is controlled to become equal to the present multiplication factor by controlling the multiplied bias level Va.

The current-to-voltage converter 9 converts a current value of the electric signal flowing due to reception of signal light of the first APD 3 into a voltage level and outputs an electric signal with the converted level to a subsequent circuit.

As explained above, the APD bias control circuit calculates the multiplication factor of the first APD 3 using the second APD 4, which has an identical characteristic to that of the first APD 3. In this case, the bias control circuit of APD impresses the multiplied bias level Va having the multiplying effect and the non-multiplied bias level Vb having no multiplying effect to the second APD and obtains the multiplication factor of the first APD from the multiplied current Ia and the non-multiplied current Ib due to reception of the signal light of the second APD 4.

when the multiplication factor is 1, the multiplication factors of the first and second APDs do not depend on temperature. As the current Ib corresponds to a multiplication factor of 1, which do not change for temperature, and the current Ia corresponds to a multiplication factor of M, which changes for temperature, a multiplication factor M is calculated by M=Ia/Ib. The multiplication factor calculating unit 6 calculates M by M=Ia/Ib, and calculated M changes in accordance to an ambient temperature change.

By calculating M by M=Ia/Ib, the bias control circuit 10 can control a multiplication factor of the first APD 3 corresponding to ambient temperature change.

Moreover, as the calculation do not related to the DC element level of the input signal, the multiplication factor of the first APD 3 can be obtained and controlled accurately. That is, even when the signal light includes DC element or the signal light has only DC element, the biasing condition of second APD 4 is not changed, with the multiplied bias level Va having the multiplying effect and the non-multiplied bias level Vb having the multiplication factor 1, and thus a multiplied current Ia and a non-multiplied current Ib flows into the second APD 4.

Figure 2:
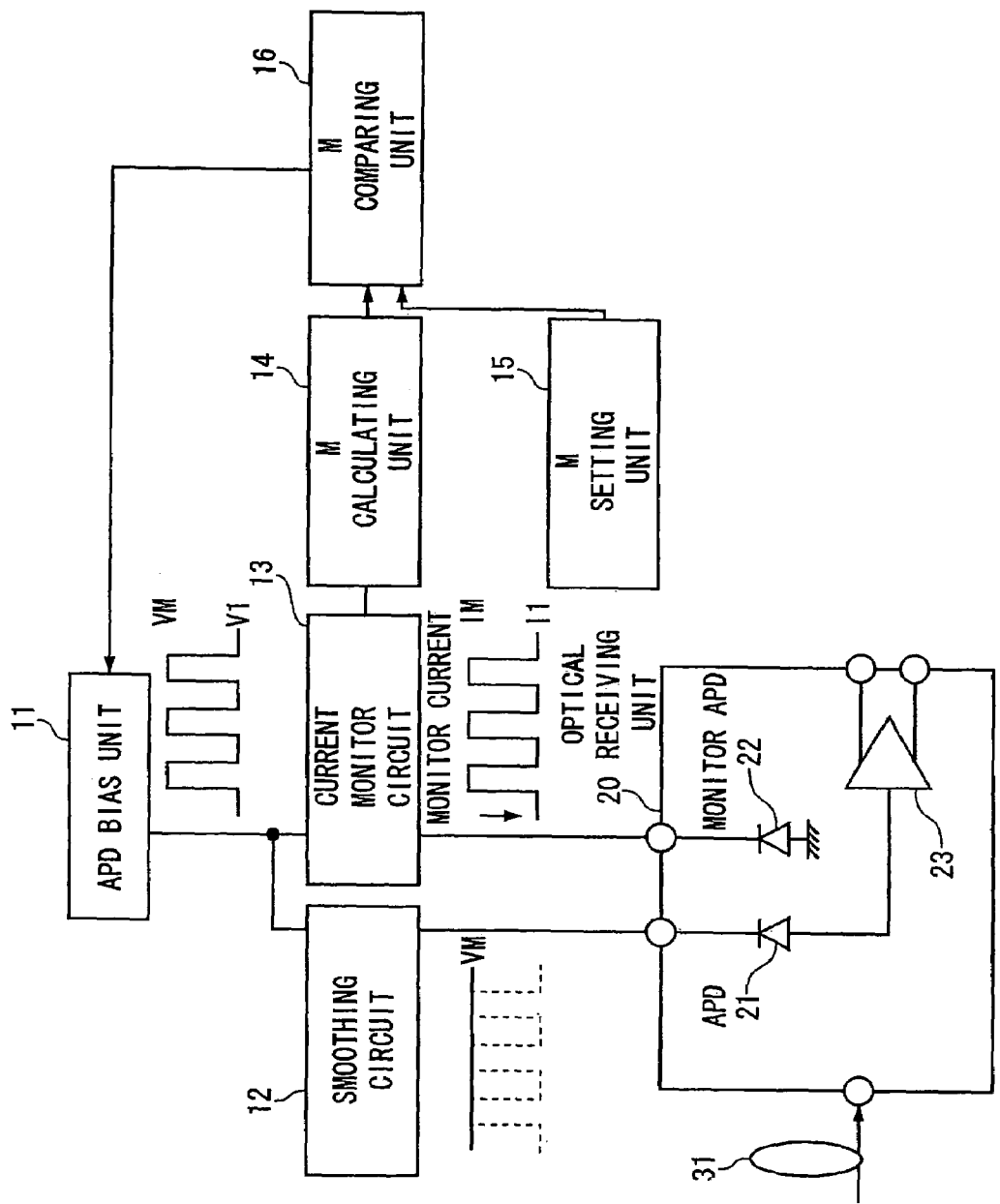
FIG. 2 is a diagram showing an APD bias control circuit of the first embodiment.

FIG. 2 is a diagram showing an APD bias control circuit. The APD bias control circuit of APD includes an APD bias unit 11, a smoothing circuit 12, a current monitor circuit 13, an M calculating unit 14, an M setting unit 15, an M comparing unit 16, and an optical receiving unit 20.

The optical receiving unit 20 has an APD 21, a monitor APD 22, and a TIA 23. A signal light is inputted to the APD 21 and the monitor APD 22 from a transmission line 31. The APD 21 and monitor APD 22 have an identical breakdown level (VB) and breakdown characteristic. The APDs with identical characteristic can be obtained by utilizing the APDs formed adjacently in a same wafer or the APDs in a same lot. TIA 23 converts a current value of an electric signal flowing due to reception of the signal light of APD 21 into an electric signal with corresponding voltage level and then outputs the electric signal to a circuit in a subsequent stage.

The APD bias unit 11 outputs a bias with its level modulated by two levels of V1 and VM, for example, by pulse electric signal as shown in FIG. 2. The bias with levels of V1 and VM is outputted to the smoothing circuit 12 and current monitor circuit 13.

The frequency of the modulated bias outputted from the APD bias unit 11 is set to the frequency sufficiently lower than the frequency of signal light (main signal). For example, when the signal light received by APD 21 is 10 Gb/s, the frequency of the modulated bias is set to 1 MHz. The reason to make the bias modulating frequency sufficiently lower is because if the frequency of the bias modulation is not sufficiently lower than the frequency of the signal light, the modulated bias for monitor APD 22 diffuses to the side of APD 21 and results in deterioration in receiving sensitivity and ALM characteristic.

The bias level V1 (having a multiplication factor of 1) causes the APD 21 and the monitor APD 22 to have no multiplying effect, and the bias level VM (having a multiplication factor of M) causes the APD 21 and the monitor APD 22 to have a multiplying effect.

The smoothing circuit 12 smoothes the bias with levels of V1 and VM, outputted from the APD bias unit 11 and biases the APD 21 with smoothed level of VM, as shown in FIG. 2. Accordingly, APD 21 has a multiplication factor M.

The current monitor circuit 13 biases the APD 22 with levels of V1 and VM, just same as the levels outputted from the APD bias unit 11. When biased by the level of V1, the monitor APD 22 has a multiplication factor 1 and when biased by the level of VM, it has a multiplication factor M. Therefore, when biased by the level of VM, the monitor APD 22 has the multiplication factor M just like APD 21 does.

APD 22 also inputs a signal light from the transmission line 31, just as APD 21. Therefore, by receiving a signal light, when biased by the level of V1 an electric signal with current I1 flows into the monitor circuit 13 and when biased by the level of VM, an electric signal with current IM flows into the current monitor circuit 13. For example, as shown in FIG. 2, an electric pulse signal with monitor current I1 and IM flows into the current monitor circuit 13. The current monitor circuit 13 monitors this electric pulse signal and outputs this current value to the M calculating unit 14.

By receiving the signal light, the amount of a current flowing into APD 21 is identical to the amount of a current IM flowing into the monitor APD 22, because the identical bias level VM is supplied. Since the monitor APD 22 has the characteristic identical to that of APD 21 as explained above, when a current flowing into APD 21 changes depending on temperature, the current IM of monitor APD 22 also changes.

The M calculating unit 14 calculates the multiplication factor of the monitor APD 22 by the current values of I1 and IM, which are monitored by the current monitor circuit 13. IM is a current value for the bias level VM, I1 is a current value for the bias level V1 with multiplication factor 1. Therefore, the multiplication factor M can be calculated by M=IM/I1. Since APE 21 is biased by the level of VM, the same level with the monitor APD 22, the multiplication factor of monitor APE 22 calculated with the M calculating unit 14 also equals to the multiplication factor of APD 21. The multiplication factor calculated with the M calculating unit 14 is outputted to the M comparing unit 16.

The multiplication factor for APE 21 is set to the M setting unit 15 and outputted to the M comparing unit 16.

The M comparing unit 16 compares the multiplication factor calculated with the M calculating unit 14 with the multiplication factor set to the M setting unit 15. The M comparing unit 16 controls the bias level VM of the APD bias unit 11 on the basis of the comparison result.

For example, when the multiplication factor of the M calculating unit 14 (actually measured multiplication factor of monitor APD 22) becomes larger than that being set to the M setting unit 15 due to temperature change, the M comparing unit 16 controls the bias level VM of the APD bias unit 11 to become smaller.

Also, when the multiplication factor of the M calculating unit 14 becomes smaller than that being set to the M setting unit 15 due to temperature change, the M comparing unit 16 controls the bias level VM of the APD bias unit 11 to become larger.

Accordingly, the multiplication factor of the APD 21 is controlled to be equal to that set to the M setting unit 15 and kept constant.

For example the M calculating unit 14 and the M comparing unit 16 can be a CPU (Central Processing Unit) and the M comparing unit 15 can be a memory.

Figure 3:
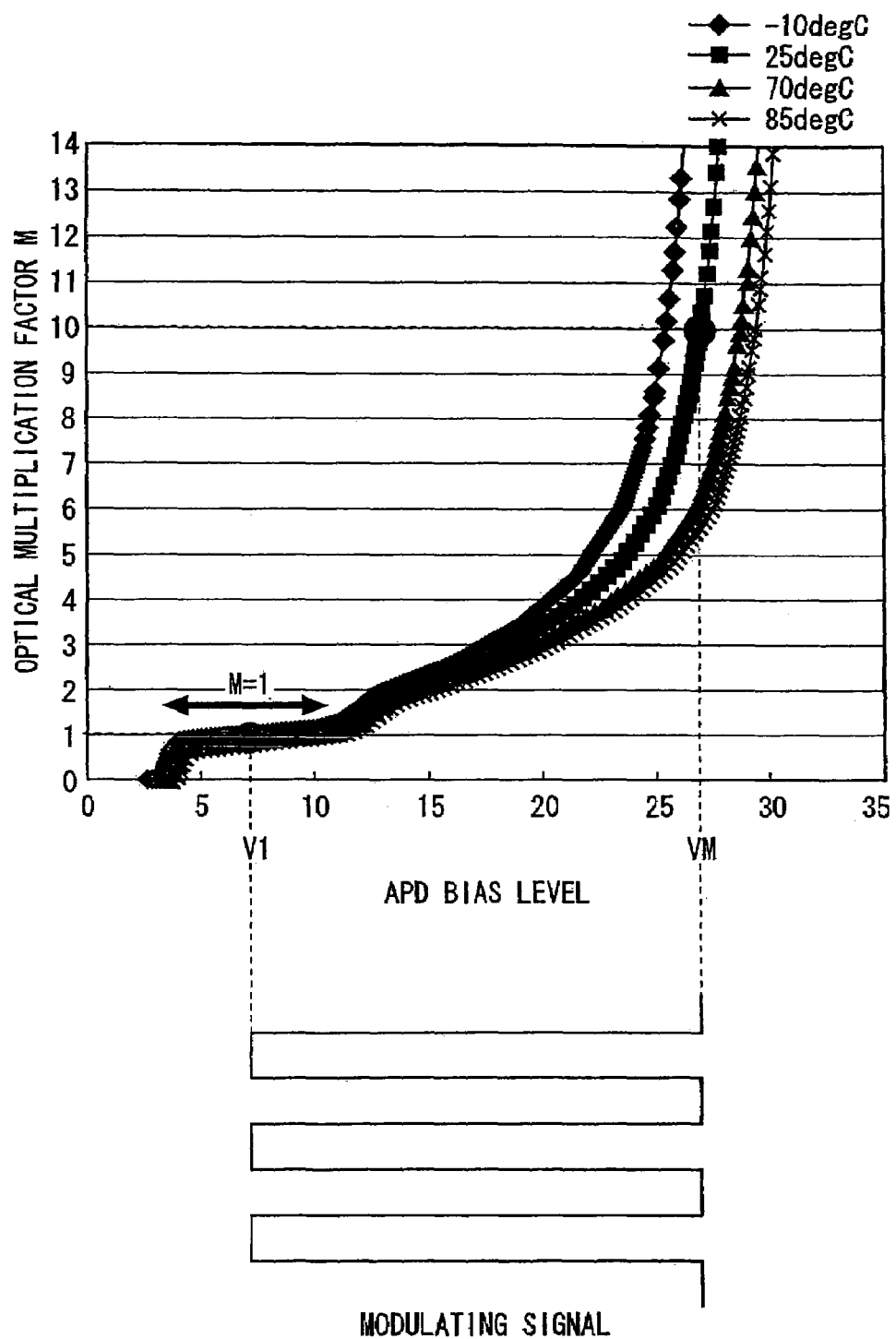
FIG. 3 is a diagram for explaining relationship between bias level and APD multiplication factor.

FIG. 3 explains relationship between bias level and multiplication factor. FIG. 3 shows the relationship between bias levels supplied to APD and multiplication factors at different temperatures of 10° C., 25° C., 70° C., and 85° C.

As shown in FIG. 3, temperature dependence of multiplication factor is extremely small within the range where the multiplication factor is around 1. The multiplication factor of APD becomes 1 irrespective of temperature when the bias level is within a range from about 4V to about 11V. When the multiplication factor is increased, temperature dependence of multiplication factor increases and results in multiplication factor fluctuation. For example, in order to set the multiplication factor of APD to 10 the bias level must be set to about 24V for 10° C. and to about 26V for 25° C.

To attain the multiplication factor 1, the APD bias unit 11 biases by the level of V1 and V1 can be within the range from 4V to 11V, such as 7.5V.

On the other hand, the bias level of VM is controlled with the M comparing unit 16 to provide the multiplication factor of the monitor APD 22 equal to that set by the M setting unit 15. Here, the multiplication factor of the monitor APD 22 can be obtained with the following equation (1) from current values of I1 and IM of an electric signal flowing into the monitor APD 22.

$$M = IM/I1 \tag{1}$$

The current value of I1 corresponding to the multiplication factor 1 (bias level of V1) does not depend on temperature. The current value of IM corresponding to the multiplication factor M (bias level VM) depends on temperature. Accordingly, the M comparing unit 16 can control the bias level of VM on the basis of the actually measured multiplication factor of the monitor APD 22 calculated by the equation (1).

Since the bias control circuit of APD shown in FIG. 2 controls the bias level based on the multiplication factor of the monitor APD 22 having the characteristic identical to that of APD 21, the bias level control is made without use of the attached data of APD 21 and the multiplication factor of APD 21 can be controlled adequately even when ambient temperature changes.

Moreover, since the multiplication factor of the APD 21 can be obtained from the equation (1), which only relates to the modulated bias levels of V1 and VM that are applied to the monitor APD 22 and the current values of I1 and IM of the electronic signal that flow into the APD 21, obtaining the multiplication factor of the APD 21 is not affected by the DC element of the input signal light and possible even when DC element of signal light increases and when only DC light is inputted to the APD 21.

Figure 4:
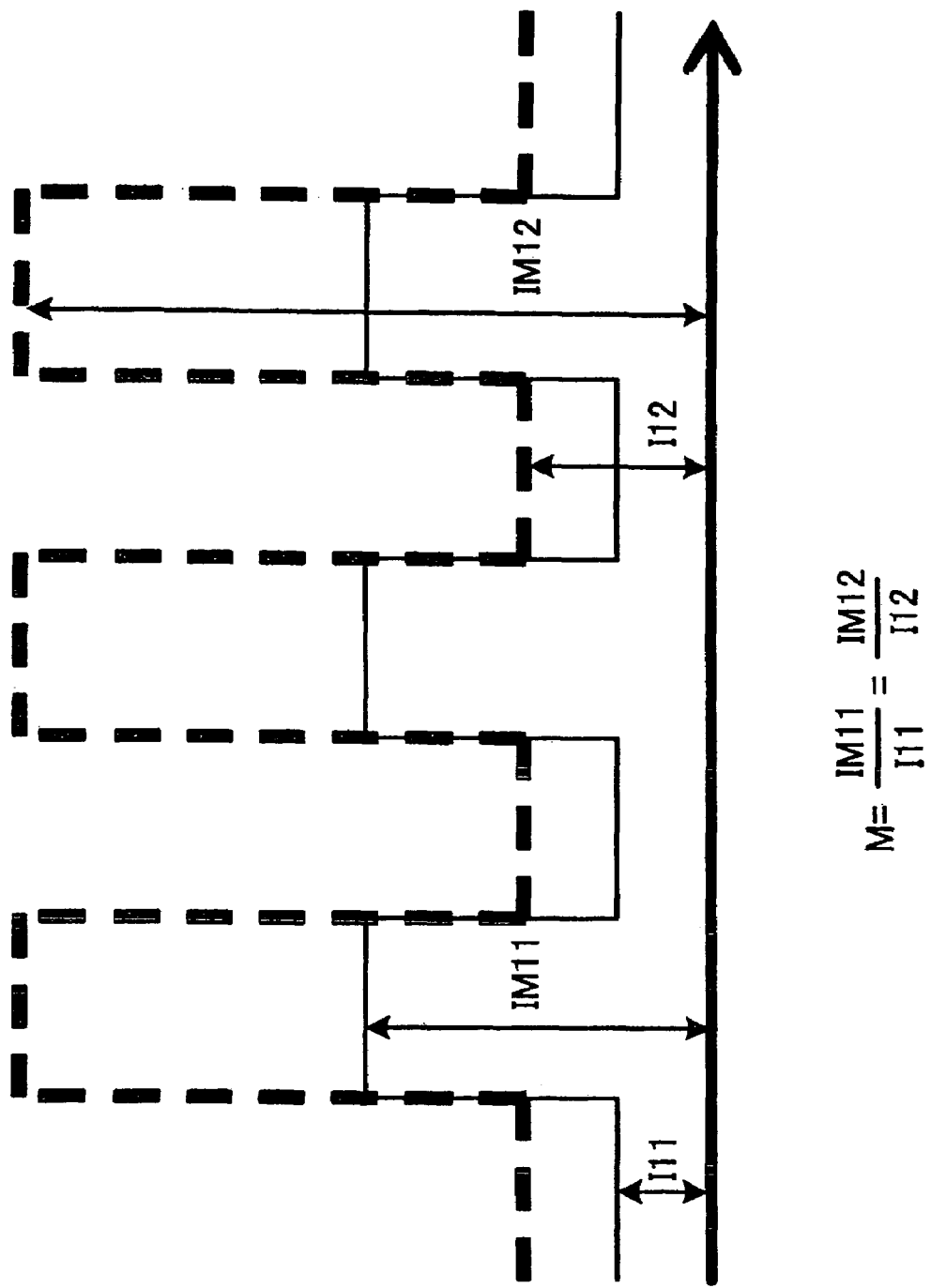
FIG. 4 is a diagram for explaining relationship between APD multiplication factor and light intensity of APD input signal light.

FIG. 4 explains relationship between multiplication factor of APD and optical intensity of the signal light. In FIG. 4, there are shown two sets of current values flowing into the monitor APD 22, for signal lights with different optical intensity. The one is with current values of I11 and IM11 and the other is with current values of I12 and IM12. When the bias levels of V1 and VM are constant, a ratio of the current values of I11 and IM11 is identical to that of the current values of I12 and IM12 even if optical intensities of the signal lights are different. In other words, even if optical intensities of signal lights are different, multiplication factor does not change if the bias levels of V1 and VM are constant. That is because if optical intensity of signal light changes, both current values of I11 and IM11 also change in accordance with such change and a ratio thereof does not change.

Figure 5:
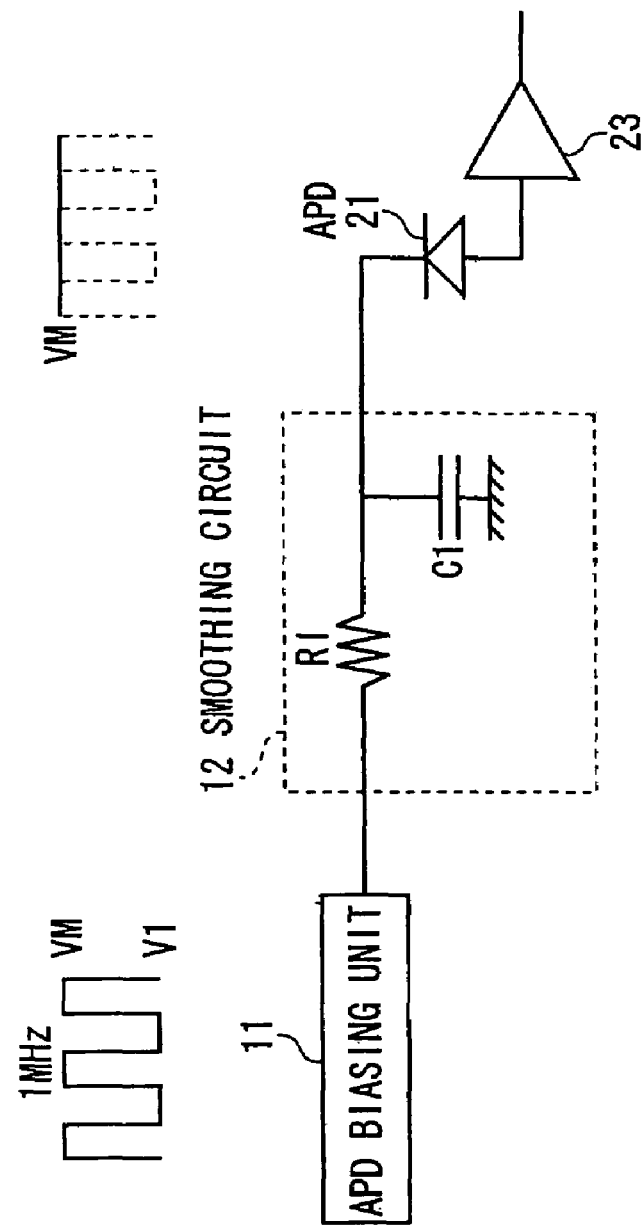
FIG. 5 is a diagram showing details of smoothing circuit.

FIG. 5 shows details of the smoothing circuit. FIG. 5 also shows the APD bias unit 11, the APD 21, and the TIA 23 shown in FIG. 2 together with the smoothing circuit 12. The smoothing circuit 12 can be an LPF RC circuit with a resistor R1 and a capacitor C1.

Frequency of the pulse signals with bias levels of V1 and VM outputted from the APD bias unit 11 is 1 MHz and a cut-off frequency of the smoothing circuit 12 is set to about 50 Hz in order to smooth the pulse signal to the bias level of VM.

In order to remove pulse element of a pulse signal as much as possible and smooth the signal to the bias level of VM, it is required to increase an RC constant. Taking account of a mounting area of the devices or dielectric strength voltage, it is preferable to have a resistor R1 with about 3 kΩ and a capacitor C1 with about 1 µF.

When the pulse signal is smoothed by the smoothing circuit 12, the level of the smoothed signal changes with a gradual discharge curve along an exp(−t/RC). For R1=3 kΩ and C=1 µF, exp (−t/RC) is 0.9997 and variation of bias level of VM by the smoothing circuit 12 is suppressed to within about ±0.03%. That means variation of the multiplication factor by the smoothing circuit 12 may be limited to about 0.07%, following equation (2). Thus, the bias level VM is applied to APD 12 within the level where influence of the smoothing circuit 12 can be neglected.

$$M = 1/\{1-(VAPD/VB)^n\} \tag{2}$$

VAPD denotes a bias level of APD, VB denotes a breakdown voltage of APD, and n denotes a fitting coefficient (n=1.2).

Figure 6:
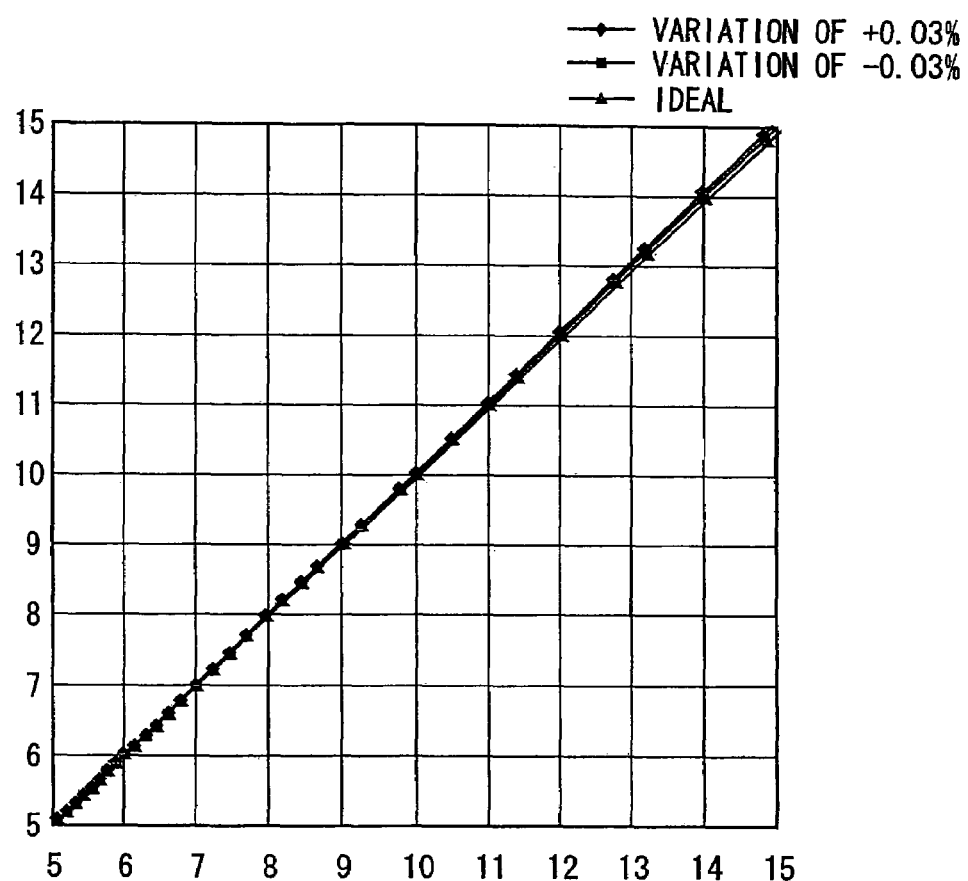
FIG. 6 is a diagram showing error of multiplication factor due to the smoothing of bias level.

FIG. 6 shows influence to a multiplication factor by smoothing the bias level. In FIG. 6, the horizontal axis indicates a target multiplication factor and the vertical axis indicates a multiplication factor of the APD 21 when VM is smoothed with the smoothing circuit 12.

It is preferable that a multiplication factor using the smoothing circuit matches a target multiplication factor. For example, when the target multiplication factor on the horizontal axis is 10, it is preferable that the multiplication factor of the vertical axis is also 10. In other words, when the bias levels of V1 and VM are smoothed with the smoothing circuit 12, multiplication factor of APD 21 is preferable to be 10).

As explained above, when the resistor R1 is 3 kΩ and capacitor C1 is 1 µF in the smoothing circuit 12, variation of the bias level applied to APD 21 is about ±0.03% and variation of multiplication factor due to the variation of the bias level VM is about ±0.07%.

FIG. 6 shows relationships between the target multiplication value and multiplication value using the smoothing circuit, in conditions with an ideal condition, +0.03% change of the bias level VM, and −0.03% change of the bias level VM. As shown in the figure, it may be obvious that even when the bias levels of V1 and VM applied to APD 21 are smoothed with the smoothing circuit 12, with a resistor R1 of 3 kΩ and a capacitor C1 of 1 µF, the multiplication factor is almost overlapped on the ideal multiplication factor.

Figure 7:
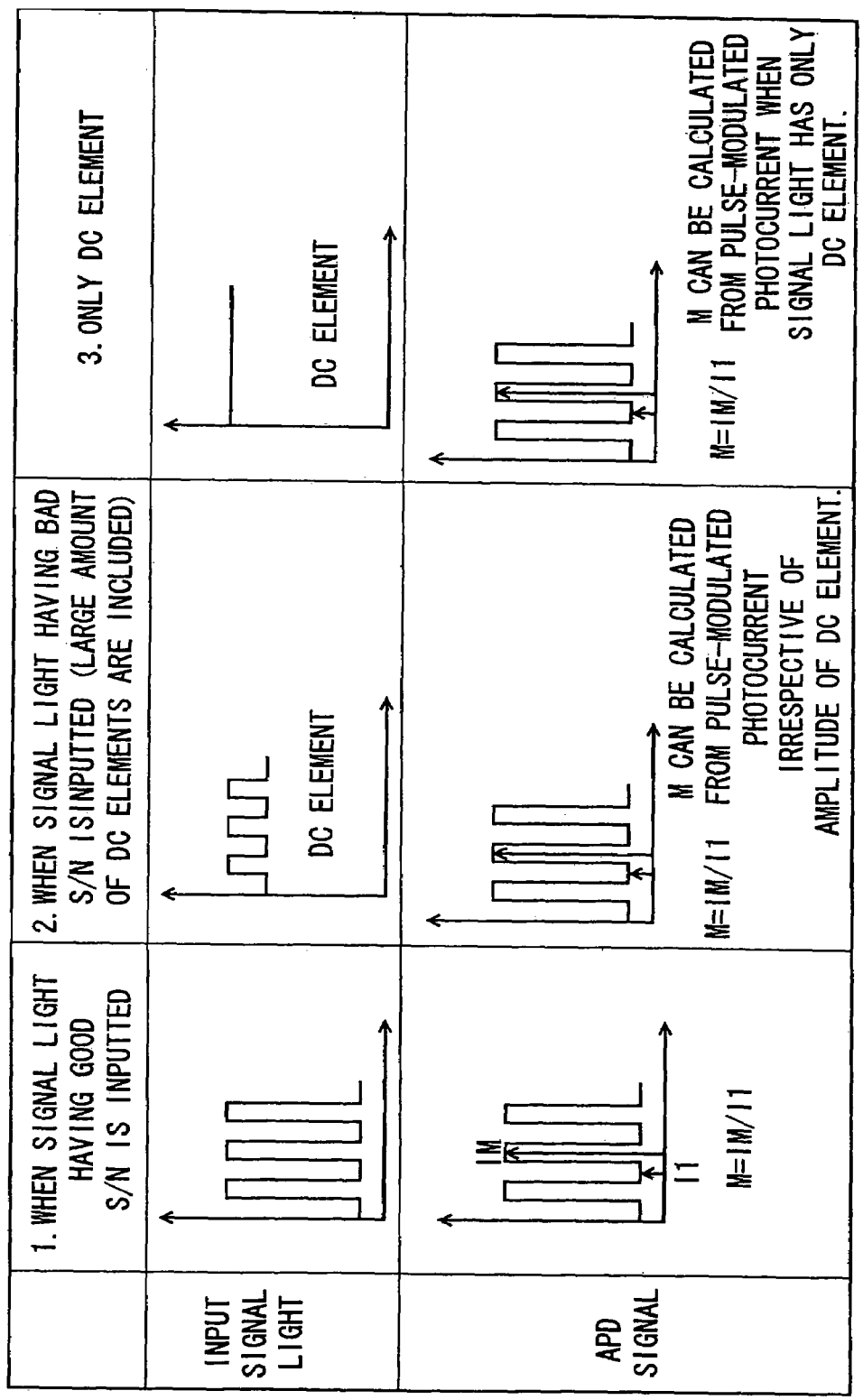
FIG. 7 is a diagram for explaining operations of bias level control circuit when DC element of input signal light increases and when input signal light has only DC element.

FIG. 7 explains operations of the bias level control circuit when DC element of the signal light increases and when the signal light has only DC light element. An input signal light in the first row shows a signal light inputted from the transmission line. An APD signal in the second row shows a current flowing into the monitor APD 22 due to reception of the signal light. The current IM indicates the current flowing due to reception of the signal light when the bias level VM of the monitor APD 22 is applied, and the current I1 indicates the current flowing due to reception of the signal light when the bias level V1 of the monitor APD 22 is applied.

In a case when a signal light as shown in column (1.) of FIG. 7 is inputted to the monitor APD 22, a current with a waveform shown in the second row of APD signal flows due to reception of the signal light in the monitor APD 22.

The current I1 flows when the bias level is V1 as explained above. The bias level of V1 results in the multiplication factor 1 for the monitor APD 22. Thus, the current I1 corresponds to the multiplication factor 1 and does not depend on temperature.

On the other hand, when the current IM flows when the bias level is VM, the multiplication factor is M and the multiplication factor changes in accordance with temperature change of the monitor APD 22.

Accordingly, the multiplication factor M (M=IM/I1) obtained by dividing the current value IM with the current value I1 indicates the actual multiplication factor (actually measured multiplication factor of the monitor APD 22) changing in accordance with temperature change of the monitor APD 22. This monitor APD 22 has the characteristic identical to that of APD 21 and the actually measured multiplication factor obtained from the monitor APD 22 indicates the actual multiplication factor of APD 21. Therefore, the multiplication factor of APD 21 can be controlled properly even for ambient temperature change, by controlling the actually measured multiplication factor of the monitor APD 22 to become equal to that preset by the M setting unit 15.

In the case when a signal light including considerable amount of DC element is inputted to the monitor APD 22 as shown in (2) of FIG. 7, the multiplication factor M (M=IM/I1) can be obtained from the current I1 flows in when the bias level of V1 is applied and the current IM flows in when the bias level of VM is applied without relation in amount of the DC element included in the light.

In the case when the signal light has only DC element as shown in column (3.) of FIG. 7 is inputted to the monitor APD 22, the multiplication factor M (M=IM/I1) can be obtained from the currents I1 and IM, because the current I1 flows in when the bias level of V1 is applied and the current IM flows in when the bias level of VM is applied.

As explained above, the bias control circuit for of APD calculates the multiplication factor of APD 21 using the monitor APD 22 having the characteristic identical to that of APD 21. In this case, the bias control circuit of APD obtains the multiplication factor of APD 21 from the current IM corresponding to the multiplication factor M and the current I1 corresponding to the multiplication factor 1 flowing into the monitor APD 22 by applying, to the monitor APD 22. The bias level of VM results in the multiplication factor to M and the bias level V1 results in the multiplication factor to 1.

The multiplication factor of APD 21 and the monitor APD 22 when the multiplication factor is 1 does not depend on temperature as is explained in regard to FIG. 3. Accordingly, the M calculating unit 14 calculates the multiplication factor (M=IM/I1) depending on ambient temperature change from the current I1 corresponding to the multiplication factor 1 not depending on temperature and the current IM corresponding to the multiplication factor M depending on temperature.

Accordingly, the bias control circuit of APD can control the multiplication factor of APD 21 depending on ambient temperature change.

Moreover, even when the signal light include DC element and when the signal light has only of DC element, the current IM flows corresponding to the multiplication factor M and the current I1 flows corresponding to the multiplication 1 into the monitor APP 22 because the bias levels of VM and V1 are applied to the monitor APP 22.

Therefore, even when the signal light includes DC element and when the signal light has only DC element, the multiplication factor (M=IM/I1) of APD 21 can be obtained and the multiplication factor of APD 21 can be controlled adequately.

In addition, any deviation is not generated between the attached data of APD 21 and the actual multiplication factor of APD 21 and therefore any influence is not applied to deterioration of receiving sensitivity characteristic and generation of ALM or the like by controlling the multiplication factor of APD 21 through actual measurement of the monitor APP 22 having the characteristic identical to that of APD 21.

Next, a second embodiment will be explained in detail with reference to the accompanying figures. In the second embodiment, the multiplication factor to be set is changed in accordance with optical intensity of the signal light. For example, if optical intensity of signal light is low, the multiplication factor to be set is increased and if optical intensity of signal light is high, the multiplication factor to be set is decreased.

Figure 8:
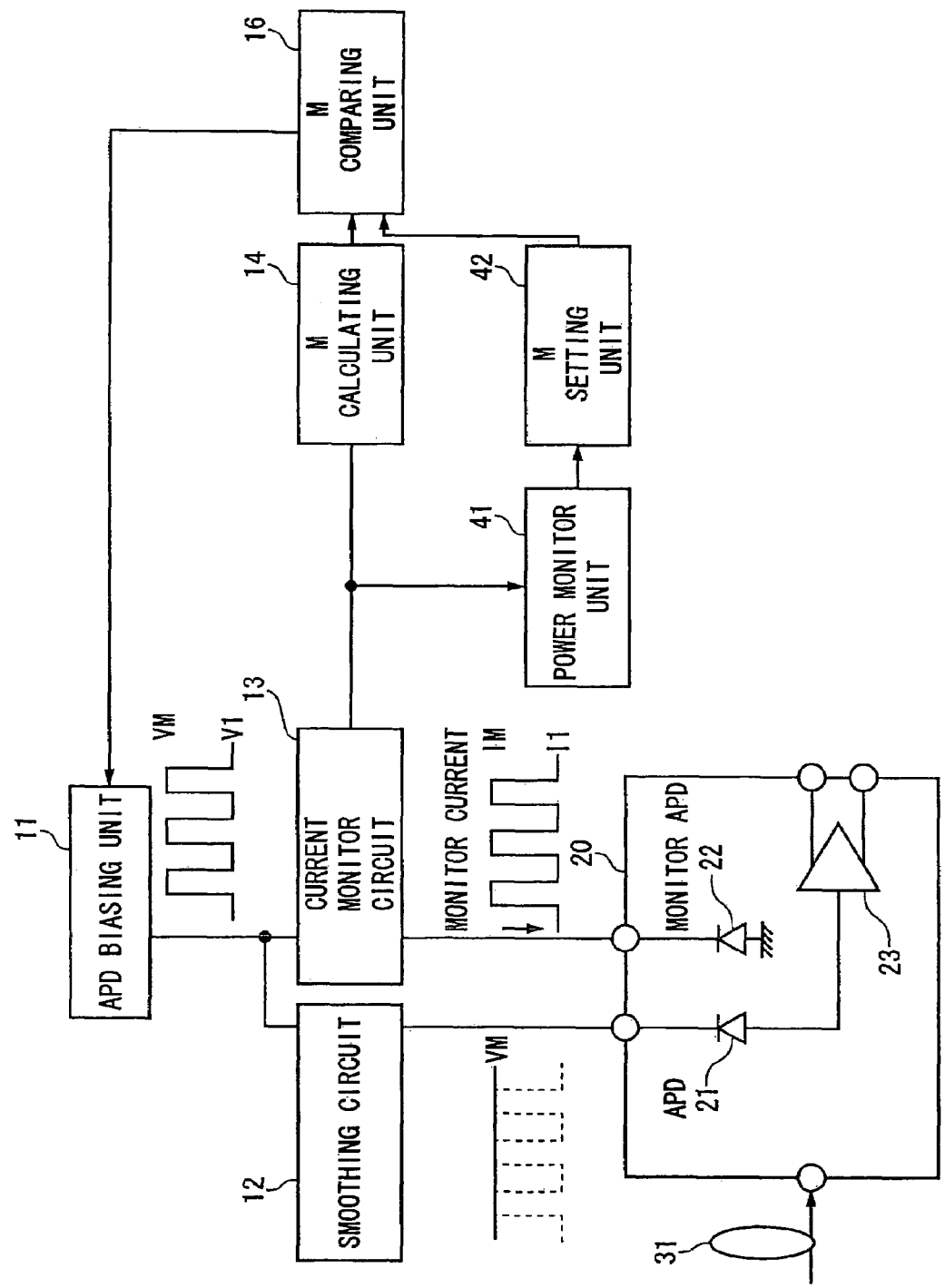
FIG. 8 is a diagram showing an APD bias control circuit of the second embodiment.

FIG. 8 shows an APD bias control circuit of the second embodiment. The elements like that of FIG. 2 are designated by the like reference numerals and explanation of these elements is omitted here.

In FIG. 8, the power monitor unit 41 detects optical intensity of the signal light received by the monitor APD 22 on the basis of the current I1 monitored with the current monitor circuit 13. Here, as the APD 21 and the monitor APD 22 receive the same signal light, the power monitor unit also detects the intensity of the signal light received by the APD 21.

The M setting unit 42 in FIG. 8 includes the preset multiplication factor table storing the multiplication factor to be set for optical intensity of the input signal light. The M setting unit 42 acquires the multiplication factor corresponding to optical intensity detected with the power monitor unit 41 on the basis of the preset multiplication table and outputs the acquired multiplication factor to the M comparing unit 16.

Figure 9:
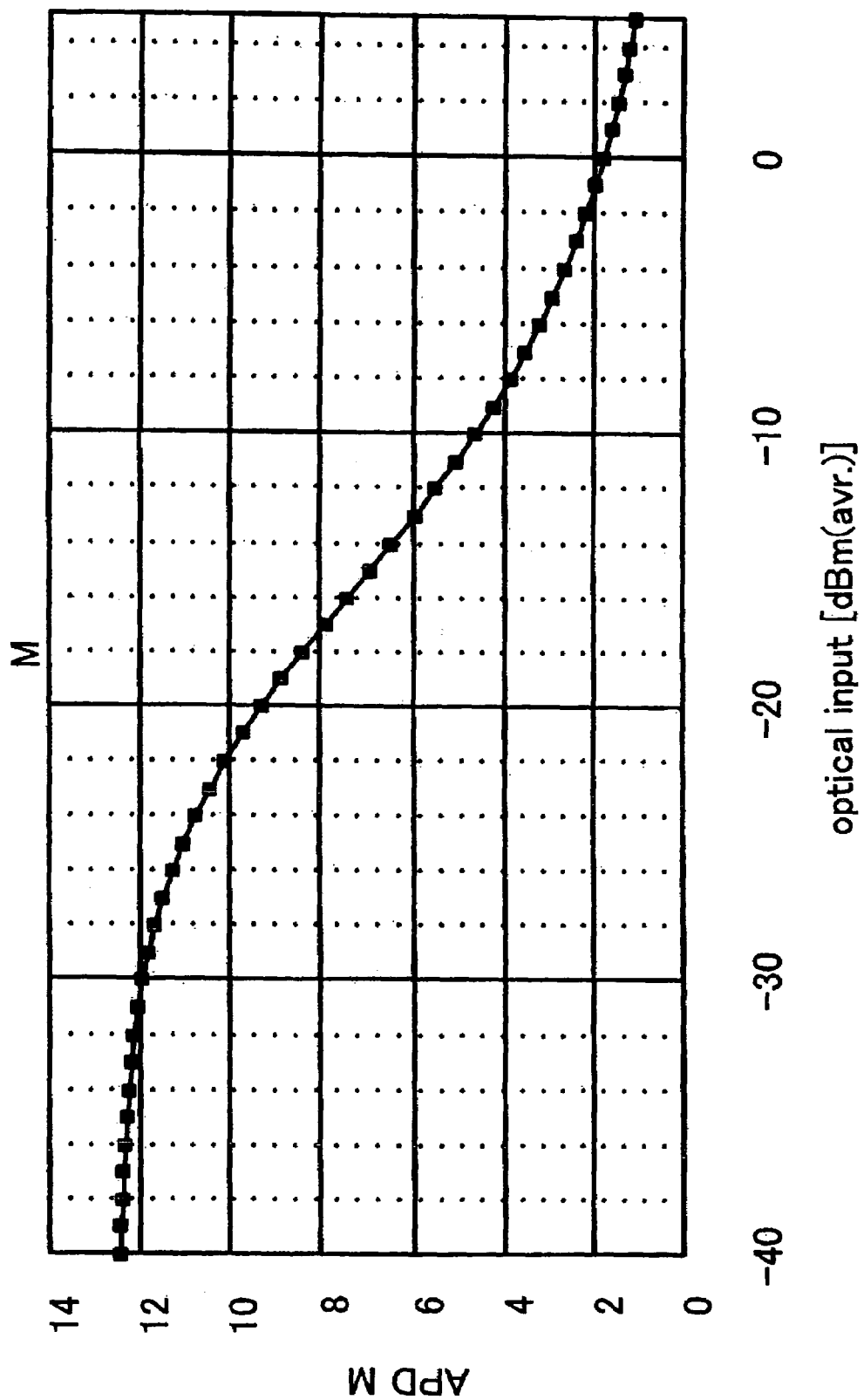
FIG. 9 is a diagram showing an example of preset multiplication factor table.

FIG. 9 shows an example of the preset multiplication table. The horizontal axis indicates optical intensity of the input signal light of the APD 21 or the monitor APD 22, while the vertical axis indicates the multiplication factor to be set.

For example, when the power monitor unit 41 has detected an optical intensity of the input signal light of APD 21 as −22 dBm based on the current I1, the M setting unit 42 acquires the multiplication factor 10 as the factor to be set from the preset multiplication factor table of the figure. The M setting unit 16 compares the actually measured multiplication factor outputted from the M calculating unit 14 with the multiplication factor outputted from the M setting unit 42 and controls the bias level VM of the APD bias unit 11 based on the comparison result.

The power monitor unit 41 calculates optical intensity $\text{Pin}_{(AVR.)}$ from the current I1 based on the following equation (3).

$$I_{APD(AVR.)} = \{(e \cdot \lambda)/(h \cdot c)\} \times \eta \times M \times \text{Pin}_{(AVR.)} \quad (3)$$

Here, $I_{APD(AVR.)}$ [A] is a mean value of photocurrent flowing into APD 21 (monitor APD 22) (mean value of the current I1 detected with the power monitor APD 41), e [C] is prime charge (1.60 E-19), λ[m] is input wavelength of APD 21 (1.56E-0.6), h[J*s] is Planck constant (6.63 E-34), c[m/s] is velocity of light(3.00 E+08) η is quantum efficiency of APD 21 (0.6), M is multiplication factor (1) of APD 21, $\text{Pin}_{(AVR.)}$ [W] is mean value of input optical power (optical intensity) of APD.

Figure 10:
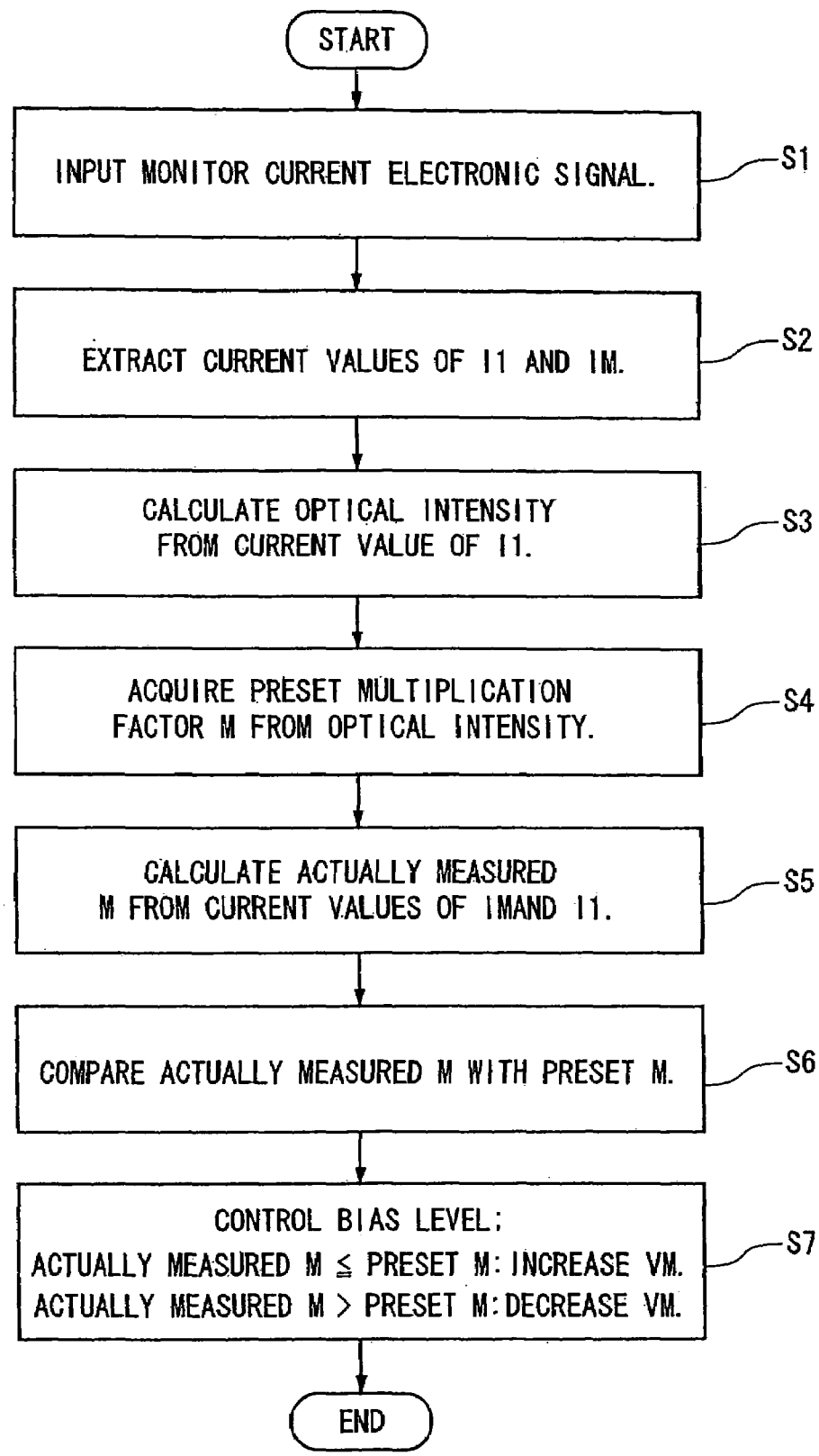
FIG. 10 is a flowchart showing bias level control.
Figure 11:
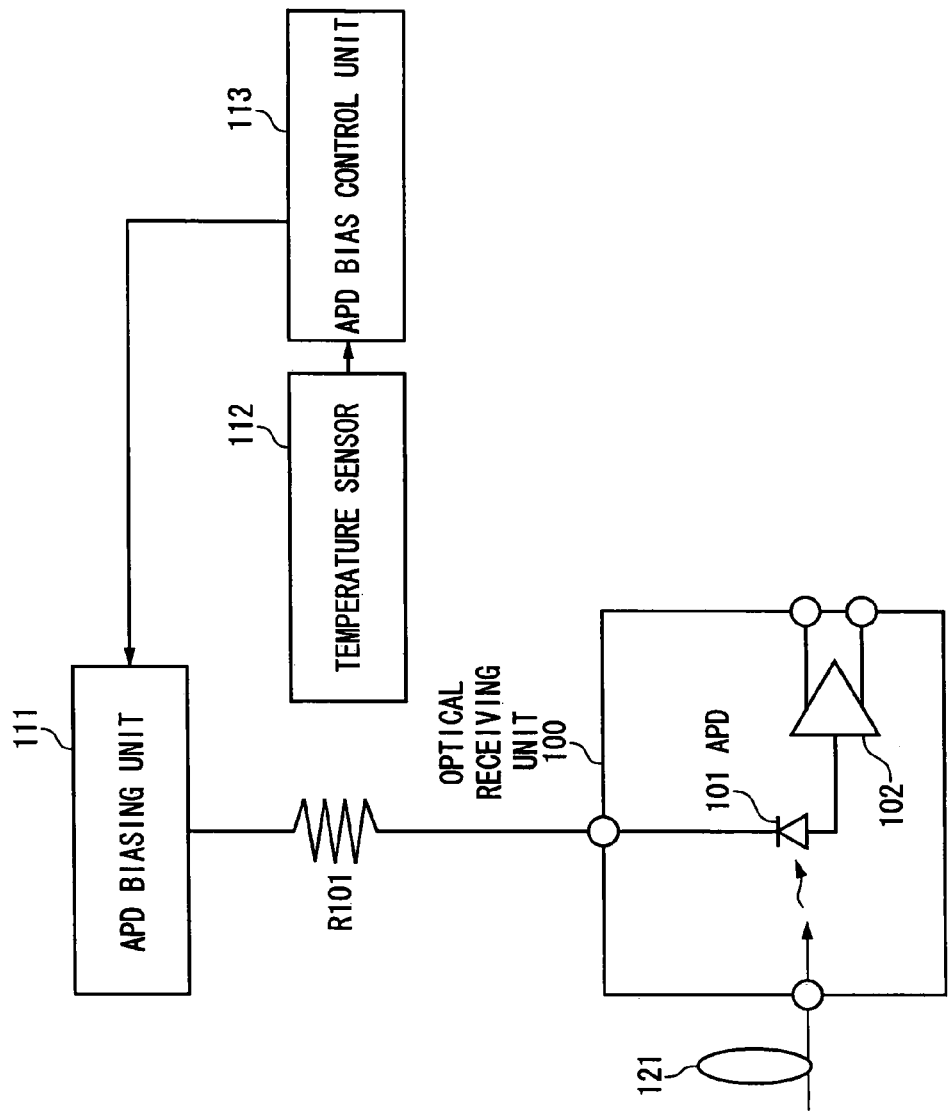
FIG. 11 is a block diagram of APD bias control circuit.
Figure 12:
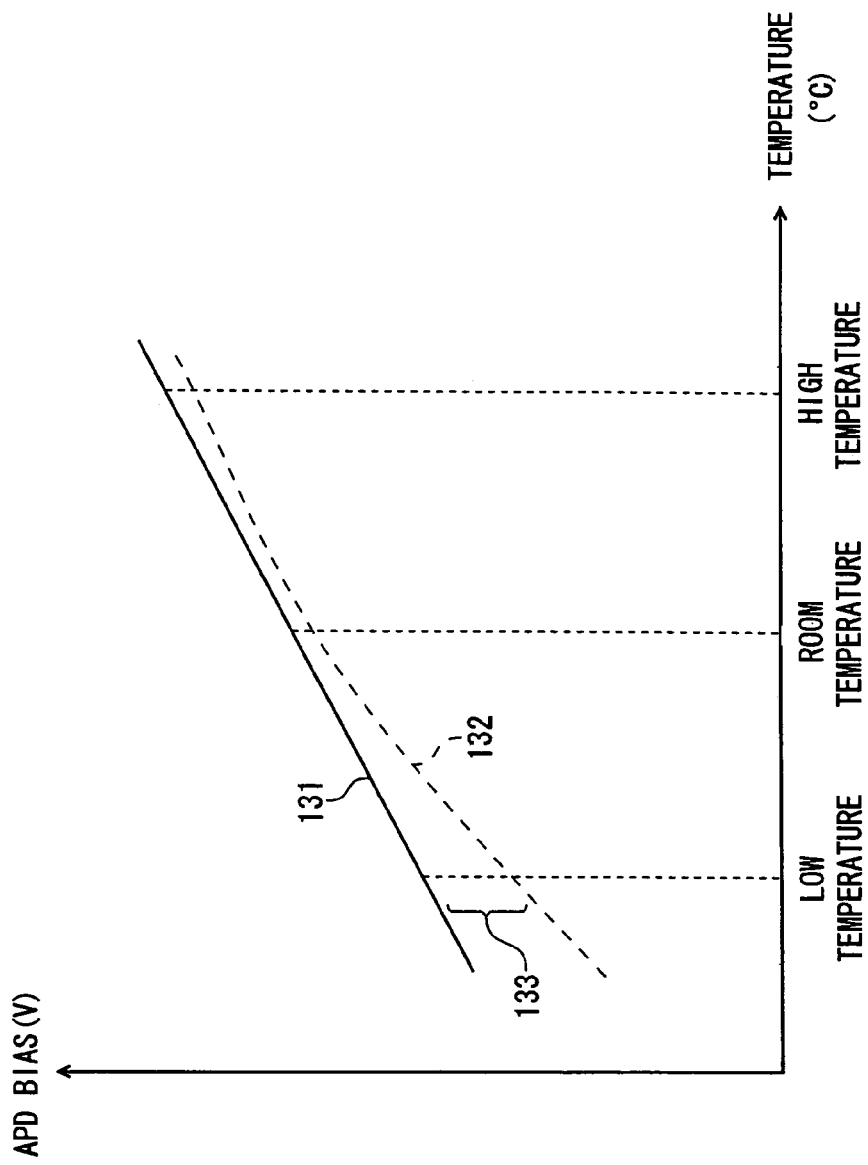
FIG. 12 is a diagram showing an example of attached data of APD.
Figure 13:
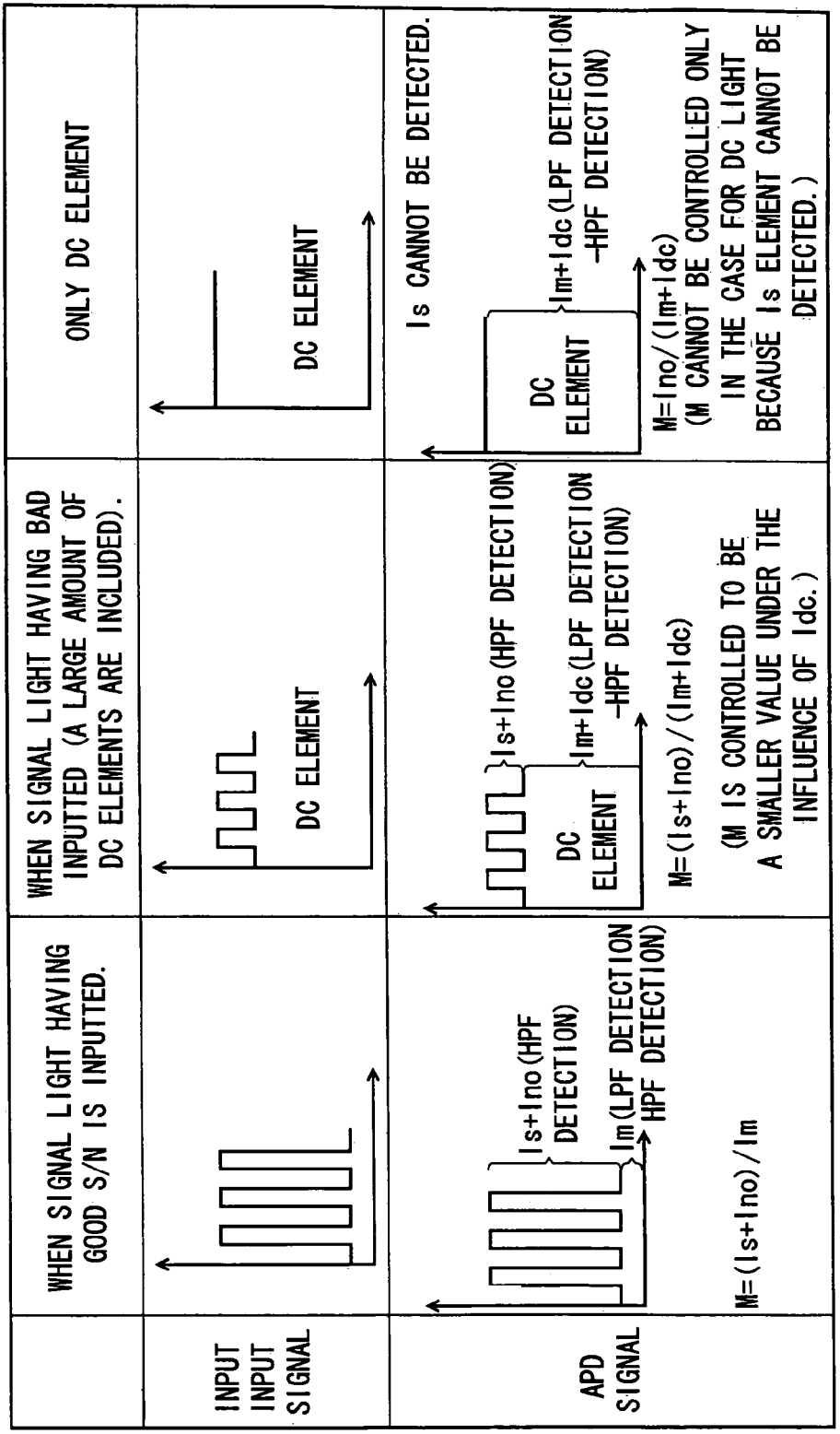
FIG. 13 is a diagram for explaining operation of bias level control circuit when DC element of input signal light increases and when the signal light has only DC element.

FIG. 10 is a flowchart showing the bias level control. The bias control circuit of APD shown in FIG. 8 controls the bias level VM in accordance with the following steps.

[Step S1] The current monitor circuit 13 inputs a monitor current signal (currents I1, IM) flowing due to reception of the signal light of the monitor APD 22.

[Step S2] The current monitor circuit 13 extracts the currents I1, IM from the input monitor current signal.

[Step S3] The power monitor circuit 41 calculates an optical intensity of the signal light received by APD 21 based on the current I1 extracted with the current monitor circuit 13. In more concrete, the power monitor unit 41 calculates optical intensity of signal light using the equation (3) explained above.

[Step S4] The M setting unit 42 acquires the multiplication factor (preset multiplication factor) corresponding to the optical intensity calculated by the power monitor unit 41, for example, with reference to the preset multiplication factor table shown in FIG. 9.

[Step S5] The M calculating unit 14 calculates the actually measured multiplication factor of the monitor APD 22 from the currents I1, IM extracted by the current monitor circuit 13.

[Step S6] The M comparing unit 16 compares the actually measured multiplication factor of the monitor APD 22 calculated by the M calculating unit 14 with the preset multiplication factor acquired by the M setting unit 42.

[Step S7] The comparing unit 11 controls the bias level VM of the APD bias unit 11 on the basis of the comparison result. For example, when the actually measured multiplication factor is equal to the preset multiplication factor or less, the M comparing unit 16 controls the bias level VM to increase and when the actually measured multiplication factor is larger than the preset multiplication factor, it controls the bias level VM to decrease.

As explained above, the bias control circuit of APD acquires the multiplication factor to be set in accordance with the input signal light. Therefore, the multiplication factor can be set in accordance with the input signal light.

Moreover, in the related art, a circuit for monitoring optical intensity has been required to conduct compensation for conversion of the multiplication factor. However, the bias control circuit of APD shown in FIG. 8 can obtain optical intensity without conversion of the multiplication factor, because optical intensity is calculated from the current I1 having the multiplication factor 1.

The present invention is not limited to the illustrated examples described above. The present invention can be variably changed without departing from the spirit and scope of the invention, as a matter of course.

What is claimed is:

1. An apparatus comprising:
 a biasing unit supplying a bias signal to a first avalanche photodiode and a second avalanche photodiode, the bias signal having a first level and a second level, the first level causing a multiplying effect and the second level causing a non-multiplying effect for the first and the second avalanche photodiodes;
 a smoothing unit smoothing the bias signal biasing the first avalanche photodiode into a smoothed bias signal;
 a current detecting unit detecting photocurrent from the second avalanche photodiode, with a multiplying current value corresponding to the multiplying bias level and a non-multiplying current value corresponding to the non-multiplying bias level;
 a multiplication factor calculating unit calculating a multiplication factor of the second avalanche photodiode based on the multiplying current value and the non-multiplying current value; and
 a control unit controlling the first level of the bias signal based on the calculated multiplication factor.

2. The apparatus according to claim 1, wherein the smoothing unit smoothes the bias signal to the first level.

3. The apparatus according to claim 1, wherein the smoothing unit includes a low-pass filter with a resistor and a capacitor.

4. The apparatus according to claim 1, further comprising:
 an optical intensity calculating unit calculating an optical intensity of a signal light inputted to the second avalanche photodiode based on the non-multiplying current value; wherein,
 the control unit controls the first level of the bias signal based on the multiplication factor calculated with the multiplication factor calculating unit and the calculated optical intensity, and the first avalanche photodiode also receives the signal light.

5. The apparatus according to claim 4, further comprising:
 a preset multiplication factor storing unit storing a present multiplication factor corresponding to an optical intensity; and
 a preset multiplication factor acquiring unit acquiring the preset multiplication factor corresponding to the optical intensity calculated with the optical intensity calculating unit; wherein,
 the control unit controls the first level of the bias signal based on the preset multiplication factor acquired with the preset multiplication factor acquiring unit.

6. The apparatus according to claim 1, wherein a frequency of the bias signal is lower than the frequency of a signal light.

7. The apparatus according to claim 6, wherein the frequency of the bias signal is a frequency that does not deteriorate a receiving sensitivity of the first avalanche photodiode.

8. An apparatus comprising:
 a first and a second avalanche photodiodes with identical characteristics;
 a biasing unit supplying a bias signal to the first avalanche photodiode and the second avalanche photodiode, the bias signal having a first level and a second level, the first level causing a multiplying effect and the second level causing a non-multiplying for the first and the second avalanche photodiodes;
 a smoothing unit smoothing the bias signal biasing the first avalanche photodiode into a smoothed bias signal;
 a current detecting unit detecting photocurrent from the second avalanche photodiode, with a multiplying current value corresponding to the multiplying bias level and a non-multiplying current value corresponding to the non-multiplying bias level;
 a multiplication factor calculating unit calculating a multiplication factor of the second avalanche photodiode based on the multiplying current value and the non-multiplying current value; and
 a control unit controlling the first level of the bias signal based on the calculated multiplication factor.

9. The apparatus according to claim 8, wherein the smoothing unit smoothes the bias signal to the first level.

10. The apparatus according to claim 9, wherein frequency of the bias signal is lower than the frequency of the signal light.

11. The apparatus according to claim 8, wherein the smoothing-unit includes a low-pass filter with a resistor and a capacitor.

12. The apparatus according to claim 8, further comprising:
 an optical intensity calculating unit calculating an optical intensity of the signal light inputted to the second avalanche photodiode based on the non-multiplying current value; wherein, the control unit controls the first level of the bias signal based on the multiplication factor calculated with the multiplication factor calculating unit and the calculated optical intensity.

13. The apparatus according to claim 12, further comprising:
   a preset multiplication factor storing unit storing a preset multiplication factor corresponding to an optical intensity; and
   a preset multiplication factor acquiring unit acquiring the preset multiplication factor corresponding to the optical intensity calculated with the optical intensity calculating unit; wherein,
   the control unit controls the first level of the bias signal based on the preset multiplication factor acquired with the preset multiplication factor acquiring unit.

14. The apparatus according to claim 8, wherein a frequency of the bias signal is lower than the frequency of a signal light.

15. The apparatus according to claim 14, wherein the frequency of the bias signal is a frequency that does not deteriorate a receiving sensitivity of the first avalanche photodiode.

16. The apparatus according to claim 8, wherein the first avalanche photodiode and the second avalanche photodiode are formed adjacently on the same wafer.

17. The apparatus according to claim 8, wherein the first avalanche photodiode and the second avalanche photodiode are manufactured in the same lot.

18. A method for controlling a first and a second avalanche photodiodes with identical characteristics, comprising:
   producing a bias signal with a first level and a second level, the first level causing a multiplying effect and the second level causing a non-multiplying for the first and the second avalanche photodiodes;
   smoothing the bias signal to the first level and biasing the first avalanche photodiode;
   biasing the second avalanche photodiode with the bias signal;
   detecting multiplying current value corresponding to the first level and non-multiplying current value corresponding to the second level;
   calculating a multiplication factor of the second avalanche photodiode based on the multiplying current value and non-multiplying current value;
   controlling the first level based on the calculated multiplication factor.

* * * * *

UNITED STATES PATENT AND TRADEMARK OFFICE
CERTIFICATE OF CORRECTION

PATENT NO. : 7,427,741 B2
APPLICATION NO. : 11/953271
DATED : September 23, 2008
INVENTOR(S) : Yasushi Koiwai et al.

It is certified that error appears in the above-identified patent and that said Letters Patent is hereby corrected as shown below:

Column 12, Line 37, after "non-multiplying" insert --effect--.

Column 12, Line 58, change "smoothing-unit" to --smoothing unit--.

Column 14, Line 8, after "non-multiplying" insert --effect--.

Signed and Sealed this

Sixteenth Day of December, 2008

JON W. DUDAS
*Director of the United States Patent and Trademark Office*